United States Patent
Chin et al.

(10) Patent No.: US 9,553,445 B2
(45) Date of Patent: Jan. 24, 2017

(54) HIGH-SPEED INPUT CIRCUIT

(71) Applicant: Rockwell Automation Asia Pacific Business Centre Pte. Ltd., Singapore (SG)

(72) Inventors: Chia Leong Chin, Singapore (SG); Yee Shing Chew, Singapore (SG); Tai Hock Khoo, Singapore (SG); Kok Kiong Lee, Singapore (SG)

(73) Assignee: Rockwell Automation Asia Pacific Business Centre Pte. Ltd., Singapore (SG)

( * ) Notice: Subject to any disclaimer, the term of this patent is extended or adjusted under 35 U.S.C. 154(b) by 123 days.

(21) Appl. No.: 14/619,567

(22) Filed: Feb. 11, 2015

(65) Prior Publication Data

US 2016/0233669 A1    Aug. 11, 2016

(51) Int. Cl.
*H02H 9/04* (2006.01)
*G05F 3/24* (2006.01)
*H03L 5/00* (2006.01)

(52) U.S. Cl.
CPC ............ *H02H 9/04* (2013.01); *G05F 3/24* (2013.01); *H03L 5/00* (2013.01)

(58) Field of Classification Search
CPC ........................................................ H02H 9/04
USPC .................................................. 361/56, 93.9
See application file for complete search history.

(56) References Cited

U.S. PATENT DOCUMENTS

| | | | | |
|---|---|---|---|---|
| 5,111,070 A * | 5/1992 | Murphy | ............... | H03K 17/302 327/100 |
| 5,243,232 A * | 9/1993 | Bolda | .................... | H03K 17/16 307/141.8 |
| 5,675,640 A * | 10/1997 | Tappert | ................. | H04M 19/04 379/374.01 |
| 5,789,960 A | 8/1998 | Bower | | |
| 5,909,660 A | 6/1999 | Foote | | |
| 6,043,703 A | 3/2000 | Bavol | | |
| 6,205,844 B1 * | 3/2001 | Morita | .................. | F02D 35/027 73/35.08 |
| 7,075,252 B1 * | 7/2006 | Blackwood | ........ | H05B 33/0812 315/291 |
| 7,091,633 B2 * | 8/2006 | Castagnet | ............. | H03K 17/94 307/131 |

OTHER PUBLICATIONS

Extended European Search Report; EP Application No. 16152501,9: Dated Jul. 18, 2016.

* cited by examiner

*Primary Examiner* — Scott Bauer
(74) *Attorney, Agent, or Firm* — Boyle Fredrickson, S.C.

(57) ABSTRACT

A high-speed input circuit for industrial control provides an optoisolator protected by a series current regulator and shunting voltage regulator. The combined effect of the regulators is to allow the input circuit to work over a wide range of voltages while providing extremely fast response time.

20 Claims, 1 Drawing Sheet

HIGH-SPEED INPUT CIRCUIT

STATEMENT REGARDING FEDERALLY
SPONSORED RESEARCH OR DEVELOPMENT

CROSS REFERENCE TO RELATED
APPLICATION

BACKGROUND OF THE INVENTION

The present invention relates to an industrial control systems and in particular to an I/O module for industrial control systems, the I/O module accommodating large voltage ranges and sensitive to high-speed switching.

Industrial control systems were originally developed to provide control logic for equipment in factories operating to manufacture products on an assembly line or in batch processes. Early industrial control systems replaced racks of relays with specialized circuitry that mimicked these relays but used a programming language.

Current industrial control systems continued this evolution, using modern electronic computer processors and circuits, but may be distinguished from standard computers by architectures that address the needs for high reliability, safety, and resistance to environmental damage and normal contamination. This latter concern generally means that industrial control system components are designed without cooling fans or ports that communicate with the outside air, placing a premium on low heat dissipation.

Industrial control systems must function in a highly varied set of manufacturing applications. For this reason, industrial control systems normally employ a modular construction form in which one or more modular controllers are teamed with local or remote I/O modules and other control devices that provide the actual interface between the controller and the hardware of sensors and actuators driving the industrial process.

One type of input I/O module operates as an interface to receive an input signal from a sensor or the like, the sensor providing an output voltage in a first voltage range indicating a low state and an output voltage in a second voltage range indicating a high state, Generally, a low state may be represented by an input voltage between zero and 10 volts and a high state may be represented by an input voltage from 10 to 32 volts.

It is important to prevent high electrical voltages originating in the controlled equipment or process from damaging the industrial control system. For this reason, I/O modules normally include an isolator. One possible isolator is an optical isolator (optoisolator/optocoupler) which provides an electrically actuated light source (an LED) insulated and isolated from a photodetector (for example, a photo diode) the latter that communicates with the remainder of the industrial control system. The optical isolator provides for good common mode rejection (that is, canceling noise that is present on both the ground and input side of the I/O module) and protects the industrial control system from extremely large voltage inputs which may accidentally be applied to the inputs of the I/O module.

Different sensors attached to an I/O module may have different output voltage ranges with high state voltages ranging from as low as 5 volts to 30 volts or more. One way of accommodating this voltage range without exceeding the current capacity of the optical isolator is to use a series limiting resistor. Such an approach may require different limiting resistors for different input voltage ranges and thus the the fabrication of multiple I/O modules for different applications.

An alternative approach is disclosed in U.S. Pat. No. 6,043,703 to Bavol, assigned to the assignee of the present invention and hereby incorporated by reference, In this invention, a transistor-based, series current limiter 28 is placed between one input of the I/O module and the light source of the optocoupler to provide to limit the current to the optocouplers over the wide input voltage range. This active regulation of series current allows a single I/O module to work over a wide input voltage range.

In these prior art designs, resistance to electrical noise is provided by a noise limiting capacitor and shunt resistor placed in parallel across the optocoupler's input. The capacitor serves to bypass high-frequency noise signals, and a resistor and a capacitor serve to provide a load that tends to diminish low-power high-voltage spikes.

Modern control environments may require the processing of electrical signals from a sensor connected having extremely high switching rates, for example, operating at frequencies of up to four megahertz and requiring a pulse width measurement having accuracies within plus or minus 30 nanoseconds. It is difficult to obtain high frequency response over a large voltage range of input voltages while preserving immunity against electrical noise.

SUMMARY OF THE INVENTION

The present invention provides an I/O input module that works over a wide range of input voltages with good noise immunity and yet provides sensitivity to extremely short pulse widths. This is possible through the use of a two-step limiting approach which employs both a transistor-based current limiter in series with the optical isolator input and a transistor-based active voltage clamp bridging the input of the optical isolator.

Specifically, the invention provides an input circuit for an industrial control system having input terminals for receiving a sensed voltage and providing a current path between the input terminals. An optical isolator has an input LED connected in series along the current path between the input terminals so that current flow between the input terminals in a first direction illuminates the LED and an active current limiter is placed in series along the current path with the LED to limit current flow to the LED. An active current shunt is placed in parallel across the LED to limit current flow to the LED.

It is thus a feature of at least one embodiment of the invention to provide an input circuit that may respond to voltage pulses having a wide range of peak values while limiting the current through the LED of the optical isolator to prevent degradation of its switching speed.

The active shunt may provide at least one transistor operating to shunt current of the current path around the LED according to an input signal.

It is thus a feature of at least one embodiment of the invention to employ an active shunting that can provide high-speed shunting when high-voltage pulses are applied to the input terminals.

The input signal is a function of current passing through the LED.

It is thus a feature of at least one embodiment of the invention to provide a shunting that is responsive to current flow through the LED so that the LED is guaranteed to be properly forward-biased before voltage limiting.

The transistor may be biased to an off state when there is no current flow in the current path.

It is thus a feature of at least one embodiment of the invention to reduce unnecessary power dissipation in the input circuit allowing high circuit density and yet permitting the I/O module to be sealed against the environment without fans.

The transistor may limit the voltage across the LED to a constant predetermined value for a range of voltages across the input terminal.

It is thus a feature of at least one embodiment of the invention to ensure fast recovery time of the photo diode at a variety of operating inputs.

The active current limiter may also provide at least one transistor operating to control current along the current path to the LED according to an input signal received by at least one transistor.

It is thus a feature of at least one embodiment of the invention to provide active current limiting that permits the optical isolator to operate within a standard current range despite wide variations in input voltages.

The input signal may be a measure of current along the current path.

It is thus a feature of at least one embodiment of the invention to provide current-sensitive current limiting to ensure proper biasing of the LED of the optical isolator.

One or both of the transistors may be a depletion mode field effect transistor biased in the conduction when there is no current flow along the current path.

It is thus a feature of at least one embodiment of the invention to provide a normally on current path providing rapid response to measurement of leading edges of input pulses.

The active limiter may provide at least two series-connected transistors operating to control current along the current path.

It is thus a feature of at least one embodiment of the invention to permit reduced cost components that may divide the input voltages and dissipated power among separate packages without exceeding their specifications.

The LED may not be shunted by a capacitor greater than one picofarad connected between the first current limiter and the LED.

It is thus a feature of at least one embodiment of the invention to eliminate the need for a capacitor for noise rejection relying instead on a high-speed active shunting circuit thereby also improving the response rate of the optical isolator.

The input circuit may further include a diode shunting the current path and oriented to be back-biased when there is a flow of current along the current path activating the LED.

It is thus a feature of at least one embodiment of the invention to provide protection of the optical isolator and current limiting circuitry against reverse voltages applied to the terminals.

The input circuit may further include a surge limiter shunting the input terminals.

It is thus a feature of at least one embodiment of the invention to protect the I/O circuitry from over voltages of the correct polarity.

The input circuit may include a parallel connected diode and resistor in series along the current path to conduct with current flow in a direction of current flow along the current path activating the LED.

It is thus a feature of at least one embodiment of the invention to permit limited reverse current flow.

The optical isolator may provide a photodetector providing a signal to a Schmitt trigger circuit driving an output of the optical isolator.

It is thus a feature of at least one embodiment of the invention to limit noise sensitivity through the use of a Schmitt trigger circuit that also avoids the need for a shunting capacitor on the input of the optical isolator.

These particular objects and advantages may apply to only some embodiments falling within the claims and thus do not define the scope of the invention.

DETAILED DESCRIPTION OF THE PREFERRED EMBODIMENT

Figure 1:
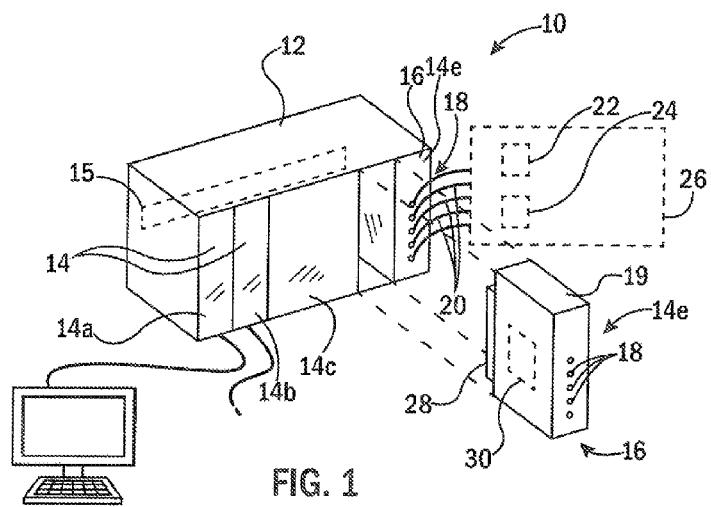
FIG. 1 is a simplified representation of an example of an industrial control system having a modular construction with an I/O module that may be installed in a housing or the like, the I/O module providing exposed terminals for communicating with an industrial control process and a rear connector for communicating with a common industrial control backplane.

Referring now to FIG. 1, an industrial control system 10 may provide for a housing 12 or similar support that assembles together multiple modules 14 to communicate together on a common industrial control backplane 15 when so assembled. Modules 14 may generally include an industrial controller 14a executing a control program, a communication module 14b, for example, communicating on an industrial control network (such as those using Common Industrial Protocols (CIP) such as EtherNet/IP, DeviceNet, and ControlNet), a power supply 14c, and one or more I/O modules 14e to be discussed herein.

One I/O module 14 may be an input module 16 having a set of electrical terminals 18 on a front face of a housing 19, the terminals 18 adapted to be connected to conductors 20 that may communicate with various sensors 22 and 24 of an industrial process 26. A rear face of the housing 19 may provide an electrical connector 28 that may communicate with a corresponding connector on the backplane 15.

It will be appreciated that backplane 15 may be alternatively contained partially within each module 14 and formed by interconnections via connector pairs (not shown) on each of the modules 14 connecting with adjacent modules when the modules 14 are assembled together.

Figure 2:
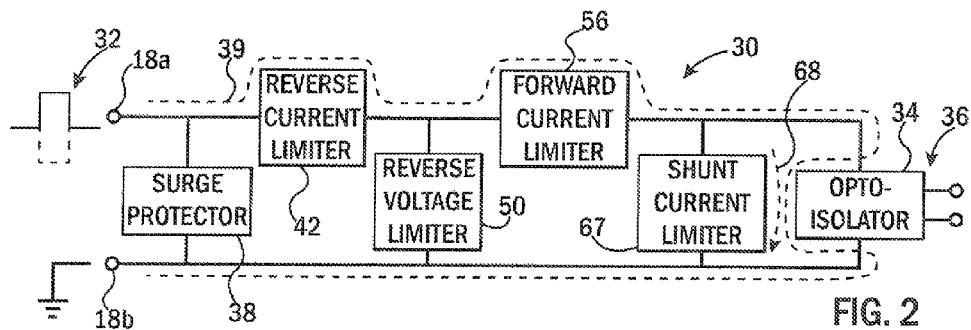
FIG. 2 is a functional block diagram of the circuit of the I/O module of FIG. 1.

Referring now also to FIG. 2, the input module 16 may include an input circuit 30 held within the housing 19 and providing electrical isolation to protect the industrial control system 10 from external high voltages. The input circuit 30 may receive, across a first and second terminal 18a and 18b, one or more pulses 32 at input terminal 18a from an associated sensor and being either positive- or negative-going with respect to a ground reference at terminal 18b. Desirably, the input circuit 30 may respond to a positive-going pulse from 4 to 32 volts occurring at frequencies as high as four megahertz and providing for a pulse-width detection accurate to plus or minus 30 nanoseconds.

A positive-going pulse 32 generates a current along a current path 39 received by an input of an optical isolator 34 which provides outputs 36 which may be communicated through a backplane interface to the backplane 15.

Figure 3:
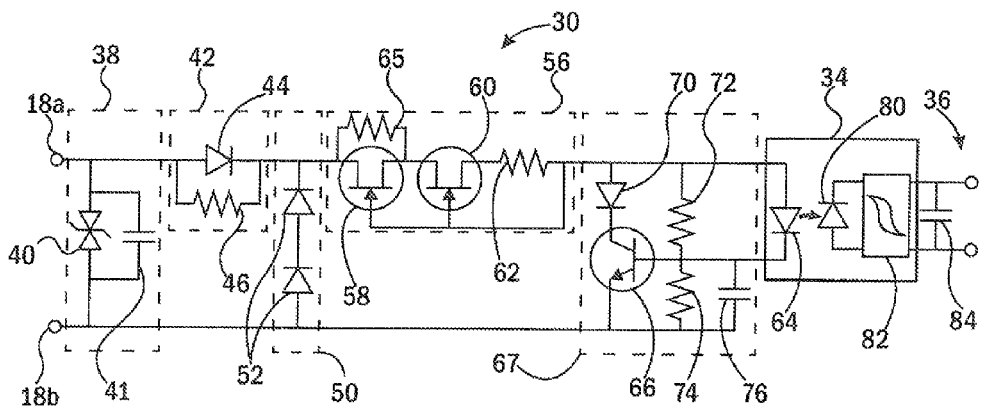
FIG. 3 is a detailed schematic diagram of the circuit of FIG. 2.

Terminals 18a and 18b of the input circuit 30 are shunted by a surge protector 38 that limits the voltage difference between terminals 18a and 18b. As shown in FIG. 3, the surge protector 38 is placed to bypass the current path 39 and may be a transient-voltage-suppression (TVS) diode 40 in parallel with a capacitor 41. The TVS diode 40 will be rated at a voltage higher than the highest expected operating voltage of the input circuit 30.

Following the TVS diode 40 may be a reverse current limiter 42 placed along the current path 39 and connected to the junction between terminal 18a and surge protector 38. The reverse current limiter 42 may limit current passing along current path 39 in a reverse direction from terminal 18b to terminal 18a, for example, when the pulse 32 is negative-going. This reverse current limiter 42 may comprise a diode 44 back-biased by reverse current along current path 39 and shunted by a resistor 46. Forward current along current path 39 from terminal 18a and 18b passes through the diode 44 with a minor forward diode voltage drop while reverse current is blocked by the diode 44 and must pass through resistor 46 which limits this current.

Following the surge protector 38 and reverse current limiter 42 is a reverse voltage limiter 50 which shunts the current path 39 to allow the flow of current from terminal 18b through the reverse voltage limiter 50 backward through the reverse current limiter 42 to the terminal 18a thereby bypassing the remainder of the input circuit 30. The reverse voltage limiter 50 may comprise two series-connected diodes oriented to be forward biased by current passing backward along the current path 39 from terminal 18b to terminal 18a and limiting the voltage difference across the reverse voltage limiter 50 (and thus the voltage applied to the remainder of the input circuit 30) to approximately two diode drops or approximately 1.4 volts.

Along the current path 39 from terminal 18a, past the reverse voltage limiter 50, is a forward current limiter 56 which is in series with the input of the optical isolator 34 along the current path 39. The forward current limiter 56 thus operates to limit current to the input of the optical isolator 34. The forward current limiter 56 may comprise two series-connected N-channel depletion JFET devices 58 and 60 where current passing along current path 39 passes into the drain and out of the source of device 58 and then into the drain and out of the source of device 60. Current exiting the source of device 60 passes through a resistor 62 and then to the anode of a light emitting diode 64 providing input of the optical isolator 34. A junction between the resistor 62 and the input of the optical isolator 34 is connected in parallel to the gates of devices 58 and 60. This biasing by the voltage drop across resistor 62 causes devices 58 and 60 to be normally on with low current flows and then to be progressively turned off (to higher resistance values) as current flow increases. A shunting resistor 65 may be placed across the drain and source of device 58 to reduce heat dissipation from device 58. The forward current limiter 56 allows the input circuit 30 to operate over a wide variety of different voltages at the terminals 18 without overloading the current capabilities of the input of the optical isolator 34.

A second mechanism limiting the application of electrical power to the light emitting diode 64 of the optical isolator 34 is a shunting bipolar NPN transistor 66 which provides a shunt current limiter 67 creating a bypass path 68 around the optical isolator 34. In one example, the emitter of transistor 66 communicates with the ground reference of terminal 18b and the collector of transistor 66 is connected through diode 70 to the output of the forward current limiter 56. Diode 70 is oriented to allow current flow through the transistor 66 from collector to emitter.

The base of transistor 66 is connected to a voltage divider comprised of a resistor 72 passing from the output of forward current limiter 56 (and one input of the optical isolator 34) to the base of transistor 66, and of resistor 74 passing from the base of transistor 66 to the ground reference of terminal 18b. The light emitting diode 64 of the optical isolator 34 is connected across the ends of resistor 72 in a direction to conduct electricity passing forward along the current path 39. A capacitor 76 of less than 1000 picofarads is connected across the ends of resistor 74 in order to speed up the response of the optical isolator.

It will be appreciated that the circuit of the shunt current limiter 67 limits the current through the light emitting diode 64 to less than that which would occur at a voltage equal to the sum of saturation voltage of transistor 66 and the forward diode drop of diode 70. By clamping this voltage, the response time of light emitting diode 64 in turning off is greatly reduced for example, by limiting the charging of parasitic capacitances and the like.

Light emitting diode 64 transmits light to a photodetector 80 within the optical isolator 34 which communicates with Schmitt trigger circuit 82. The Schmitt trigger circuit 82 provides hysteresis in the switching of the output 36 of the optical isolator 34. An optical isolator 34 providing these features is commercially available from Toshiba of Japan under the trade designation TLP2361 and provides a high output, gallium aluminum arsenide light emitting diode coupled with a high gain high-speed photodetector.

In one embodiment, a stability capacitor 84 may be placed across the outputs 36 of the optical isolator 34.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following

What we claim is:

1. An input circuit for an industrial controller comprising:
   input terminals for receiving a sensed voltage and providing a current path between the input terminals;
   an isolator having isolator inputs connected in series along the current path between the input terminals so that current flow between the input terminals in a first direction activates the isolator;
   a first active current limiter placed in series along the current path with the isolator inputs to limit current flow through the isolator inputs in a forward direction;
   a second active current limiter placed in series along the current path with the isolator inputs to limit current flow through the isolator inputs in a reverse direction; and
   an active current shunt placed in parallel across the isolator inputs to limit current flow through the isolator inputs.

2. The input circuit of claim 1 wherein the isolator is an optical isolator having isolator inputs connected across an LED that communicates with a photodetector.

3. The input circuit of claim 2 wherein the active current shunt provides at least one transistor operating to shunt current of the current path around the LED according to a feedback input signal.

4. The input circuit of claim 3 wherein the feedback input signal is a function of current passing through the LED.

5. The input circuit of claim 4 wherein the transistor is biased to an off state when there is no current flow in the current path.

6. The input circuit of claim 5 wherein the transistor limits a current through the input terminals to a constant predetermined value for a range of voltages across the input terminal.

7. The input circuit of claim 6 wherein the range of voltages is less than two volts.

8. The input circuit of claim 3 wherein the first active current limiter provides at least one transistor operating to control current along the current path to the LED according to a limiter input signal received by the at least one transistor.

9. The input circuit of claim 8 wherein the limiter input signal is a measure of current along the current path.

10. The input circuit of claim 9 wherein the at least one transistor is a depletion mode, field effect transistor biased in a conduction state when there is no current flow along the current path.

11. The input circuit of claim 10 wherein the active limiter provides at least two series-connected transistors operating to control current along the current path.

12. The input circuit of claim 2 wherein the LED is shunted by a capacitor greater than one picofarad connected between the active current shunt and the LED.

13. The input circuit of claim 2 further including a diode shunting the current path and oriented to be back-biased when there is a flow of current along the current path activating the LED.

14. The input circuit of claim 2 further including a surge limiter shunting the input terminals.

15. The input circuit of claim 2 further including a parallel connected diode and resistor in series along the current path to conduct with current flow in a direction of current flow along the current path activating the LED.

16. The input circuit of claim 2 wherein the photodetector provides a signal to a Schmitt trigger circuit driving an output of the optical isolator.

17. An I/O module comprising:
   a housing providing on a front face terminals for releasably receiving electrical conductors and on a rear face a backplane connector for releasably connecting to an industrial control backplane for communicating data signals when the housing is installed in a larger housing; and
   multiple input circuits held within the housing and each including:
   inputs receiving a sensed voltage from corresponding front face terminals and providing a current path between the corresponding front face terminals;
   an optical isolator having an input LED connected in series along the current path so that current flow between the corresponding front face terminals in a first direction illuminates the LED;
   a first active current limiter placed in series along the current path with the LED to limit current flow to the LED in a forward direction;
   a second active current limiter placed in series along the current path with the isolator inputs to limit current flow through the isolator inputs in a reverse direction; and
   an active current shunt placed in parallel across the LED to limit current flow to the LED.

18. The I/O module of claim 17 wherein the active shunt provides at least one transistor operating to shunt current of the current path around the LED according to an input signal being a function of current passing through the LED.

19. The I/O module of claim 18 wherein the transistor is biased to an off state when there is no current flow in the current path.

20. A method of providing high-speed voltage sensing using an input circuit having:
   input terminals for receiving a sensed voltage and providing a current path between the input terminals;
   an optical isolator having an input LED connected in series along the current path between the input terminals so that current flow between the input terminals in a first direction illuminates the LED;
   a first active current limiter placed in series along the current path with the LED to limit current flow to the LED in a forward direction;
   a second active current limiter placed in series along the current path with the isolator inputs to limit current flow through the isolator inputs in a reverse direction; and
   an active current shunt placed in parallel across the LED to limit current flow to the LED;
   the method limiting a current using the active current limiter and simultaneously shunting current around the LED using the active current shunt when the input terminals receive a voltage generating the current along the current path.

* * * * *